United States Patent
Kawano et al.

(10) Patent No.: US 9,378,940 B2
(45) Date of Patent: Jun. 28, 2016

(54) SUBSTRATE PROCESSING APPARATUS AND SUBSTRATE PROCESSING METHOD

(71) Applicant: Tokyo Electron Limited, Tokyo (JP)

(72) Inventors: Hisashi Kawano, Kumamoto (JP); Norihiro Ito, Kumamoto (JP); Yosuke Hachiya, Kumamoto (JP); Jun Nogami, Kumamoto (JP); Kotaro Ooishi, Kumamoto (JP); Itaru Kanno, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 468 days.

(21) Appl. No.: 13/916,826

(22) Filed: Jun. 13, 2013

(65) Prior Publication Data

US 2013/0340796 A1 Dec. 26, 2013

(30) Foreign Application Priority Data

Jun. 22, 2012 (JP) ................................. 2012-140599
Sep. 6, 2012 (JP) ................................. 2012-196610

(51) Int. Cl.
*H01L 21/02* (2006.01)
*H01L 21/67* (2006.01)
*H01L 21/311* (2006.01)

(52) U.S. Cl.
CPC .... *H01L 21/02057* (2013.01); *H01L 21/31133* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 2004/0261817 A1 | 12/2004 | Araki et al. | |
| 2005/0028837 A1 | 2/2005 | Nam et al. | |
| 2007/0087456 A1* | 4/2007 | Hashizume | 438/6 |
| 2007/0161248 A1* | 7/2007 | Christenson et al. | 438/689 |
| 2008/0283090 A1 | 11/2008 | Dekraker et al. | |
| 2011/0277793 A1* | 11/2011 | Inada et al. | 134/18 |

FOREIGN PATENT DOCUMENTS

| | | |
|---|---|---|
| JP | 2004-172493 A | 6/2004 |
| JP | 2010-103189 A | 5/2010 |
| TW | 201108314 A1 | 3/2011 |
| WO | 2007-062111 A1 | 5/2007 |

* cited by examiner

*Primary Examiner* — Michael Kornakov
*Assistant Examiner* — Ryan Coleman
(74) *Attorney, Agent, or Firm* — Abelman, Frayne & Schwab

(57) ABSTRACT

The present disclosure provides a substrate processing apparatus including: a substrate processing chamber configured to process a substrate on which a target layer to be removed is formed on the surface of an underlying layer; a substrate holding unit provided in the substrate processing chamber and configured to hold the substrate; a mixed liquid supplying unit configured to supply a mixed liquid of sulfuric acid and hydrogen peroxide to the substrate held by the substrate holding unit in a mixing ratio of the hydrogen peroxide and a temperature that does not damage the underlying layer while removing the target layer; and an OH-group supplying unit configured to supply a fluid containing OH-group to the substrate in an amount that does not damage the underlying layer when the mixed liquid and the OH-group are mixed on the substrate.

17 Claims, 9 Drawing Sheets

SUBSTRATE PROCESSING APPARATUS AND SUBSTRATE PROCESSING METHOD

CROSS-REFERENCE TO RELATED APPLICATIONS

This application is based on and claims priorities from Japanese Patent Application Nos. 2012-140599 and 2012-199610, filed on Jun. 22, 2012 and Sep. 6, 2012, respectively, with the Japan Patent Office, the disclosures of which are incorporated herein in their entireties by reference.

TECHNICAL FIELD

The present disclosure relates to a substrate processing apparatus and a substrate processing method in which a target layer to be removed ("a target layer") formed on an underlying layer of the surface of a substrate is removed using a mixed liquid of sulfuric acid and hydrogen peroxide.

BACKGROUND

In the related art, various wiring patterns are formed on the surface of a substrate such as, for example, a semiconductor wafer and a liquid crystal substrate when manufacturing, for example, semiconductor components or flat panel displays. When the wiring pattern is formed on the substrate, an underlying layer made of oxide layer or nitride layer is formed first on the surface of the substrate, and then, a target layer to be removed such as, for example, a resist layer or an anti-reflection layer is formed on the surface of the underlying layer in a predetermined shape. Then, a processing such as, for example, an exposing process is performed against the surface of the substrate, and the target layer is removed while remaining the underlying layer. Then, unnecessary portion of the underlying layer is removed, and thus, the wiring pattern in the predetermined shape is formed on the substrate.

In a substrate processing apparatus, the target layer is removed from the surface of the substrate using various processing chemical solutions such as, for example, a mixed liquid of sulfuric acid and hydrogen peroxide (sulfuric acid/hydrogen peroxide mixture; SPM). See, for example, Japanese Patent Laid-Open Publication No. 2010-103189.

SUMMARY

The present disclosure provides a substrate processing apparatus including: a substrate processing chamber configured to process a substrate on which a target layer to be removed is formed on the surface of an underlying layer; a substrate holding unit provided in the substrate processing chamber and configured to hold the substrate; a mixed liquid supplying unit configured to supply a mixed liquid of sulfuric acid and hydrogen peroxide to the substrate held by the substrate holding unit in a mixing ratio of the hydrogen peroxide and a temperature that does not damage the underlying layer while removing the target layer; and an OH-group supplying unit configured to supply a fluid containing OH-group to the substrate in an amount that does not damage the underlying layer when the mixed liquid and the OH-group are mixed on the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
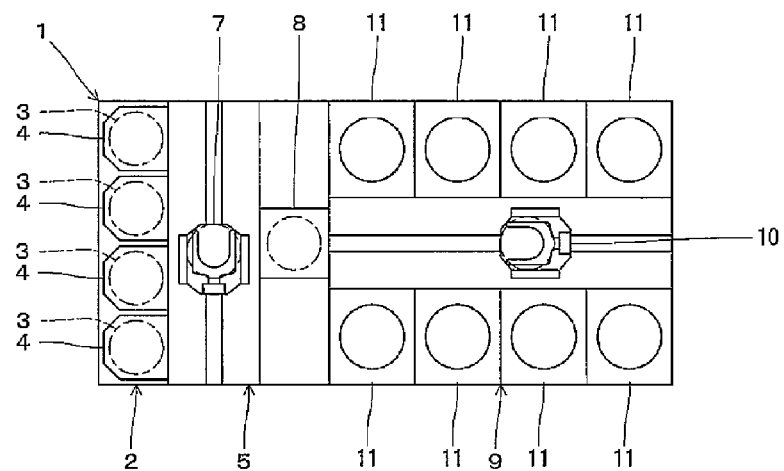
FIG. 1 is a plan view illustrating a substrate processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the conventional substrate processing apparatus, when ions with high concentration are injected to form a resist layer to promote the wiring pattern with high density, a hardened layer is formed on the surface of a resist layer which is to be a target layer to be removed. As a result, a mixed liquid of sulfuric acid and hydrogen peroxide is supplied to the substrate to remove the resist layer in a state where the liquid temperature is high (e.g., 200° C. or more) and the mixing ratio of the hydrogen peroxide is increased (e.g., sulfuric acid:hydrogen peroxide=6:1).

As described above, when the temperature of the mixed liquid of the sulfuric acid and the hydrogen peroxide is high and the mixing ratio of the hydrogen peroxide is increased, the ability to remove the target layer (the resist layer) increases, and thus, the target layer may readily be removed.

However, in the conventional substrate processing apparatus, the removing ability for the target layer increases along with the removing ability for the underlying layer, and as a result, there is a concern that the surface of the underlying layer may be damaged.

The present disclosure provides a substrate processing apparatus including: a substrate processing chamber configured to process a substrate on which a target layer to be removed is formed on the surface of an underlying layer; a substrate holding unit provided in the substrate processing chamber and configured to hold the substrate; a mixed liquid supplying unit configured to supply a mixed liquid of sulfuric acid and hydrogen peroxide to the substrate held by the substrate holding unit in a mixing ratio of the hydrogen peroxide and a temperature that does not damage the underlying layer while removing the target layer; and an OH-group supplying unit configured to supply a fluid containing OH-group to the substrate in an amount that does not damage the underlying layer when the mixed liquid and the OH-group are mixed on the substrate.

Further, the OH-group supplying unit may be configured to locally supply the OH-group to a portion where the mixed liquid is supplied from the mixed liquid supplying unit.

Further, the OH-group supplying unit may be provided at an upstream side with respect to the progressing direction of the mixed liquid supplying unit that moves relative to the substrate.

Further, the OH-group supplying unit may be configured to supply the OH-group to the entire inside of the substrate processing chamber.

Further, the OH-group supplying unit may be configured to decrease the amount of the supplied OH-group during the supply of the OH-group.

Further, the OH-group supplying unit may be configured to decrease the temperature of the supplied OH-group during the supply of the OH-group.

Further, the mixed liquid supplying unit may be configured to decrease the mixing ratio of the hydrogen peroxide included in the supplied mixed liquid during the supply of the mixed liquid.

Further, the mixed liquid supplying unit may be configured to decrease the temperature of the supplied mixed liquid during the supply of the mixed liquid.

Further, the mixed liquid supplying unit may include a twin fluid nozzle where the mixed liquid is made into droplets using inert gas.

Further, the present disclosure provides a substrate processing method including: providing a processing chamber configured to process a substrate on which a target substrate to be removed is formed on the surface of an underlying layer, the substrate being held by a substrate holding unit; supplying a mixed liquid of sulfuric acid and hydrogen peroxide to the substrate from a mixed liquid supplying unit in a mixing ratio of the hydrogen peroxide and a temperature that does not damage the underlying layer while removing the target layer, thereby removing the target layer; and supplying a fluid containing OH-group to the substrate from an OH-group supplying unit in an amount that does not damage the underlying layer when the mixed liquid and the OH-group are mixed on the substrate.

Further, the OH-group may be locally supplied to a portion to which the mixed liquid is supplied.

Further, the portion to which the mixed liquid is supplied may be moved relative to the substrate, and the OH-group may be supplied at an upstream side with respect to the progressing direction of the moving portion to which the mixed liquid is supplied.

Further, the OH-group may be supplied to the entire inside of the substrate processing chamber.

Further, the amount of the supplied OH-group may be decreased during the supply of the OH-group.

Further, the temperature of the supplied OH-group may be decreased during the supply of the OH-group.

Further, the mixing ratio of the hydrogen peroxide included in the supplied mixed liquid may be decreased during the supply of the mixed liquid.

Further, the temperature of the supplied mixed liquid may be decreased during the supply of the mixed liquid.

Further, the mixed liquid may be made into droplets using inert gas to be supplied.

In the present disclosure, the target layer may readily be removed without damaging the underlying layer.

Hereinafter, the specific configuration of a substrate processing apparatus and a substrate processing method according to the present disclosure will be described with respect to the accompanying drawings.

Referring to FIG. 1, a substrate processing apparatus 1 includes a carrying-in/carrying-out part 2 in the front end portion thereof. In the carrying-in/carrying-out part 2, a carrier 4 that accommodates a plurality of substrates (e.g., 25 sheets of semiconductor wafers) are carried-in/carried-out.

Further, the substrate processing apparatus 1 includes a transport part 5 at the rear side of the carrying-in/carrying-out part 2. The transport part 5 includes a substrate transporting device 7 disposed in the front side thereof and a substrate transferring table 8 disposed in the rear side thereof. In the transport part 5, a substrate 3 is transported between the substrate transferring table 8 and any one of the carriers 4 disposed in the carrying-in/carrying-out part 2 using the substrate transporting device 7.

Further, the substrate processing apparatus 1 includes a processing part 9 at the rear side of the transport part 5. The processing part 9 includes a substrate transporting device 10 extending in a forward and rearward direction disposed at the center thereof and substrate liquid processing devices 11 disposed in parallel at right and left sides of the substrate transporting device 10. In the processing part 9, the substrate 3 is transported between the substrate transferring table 8 of the transport part 5 and one of the substrate liquid processing devices 11 using the substrate transporting device 10, and a liquid processing for the substrate 3 is performed using one of the substrate liquid processing devices 11.

Figure 2:
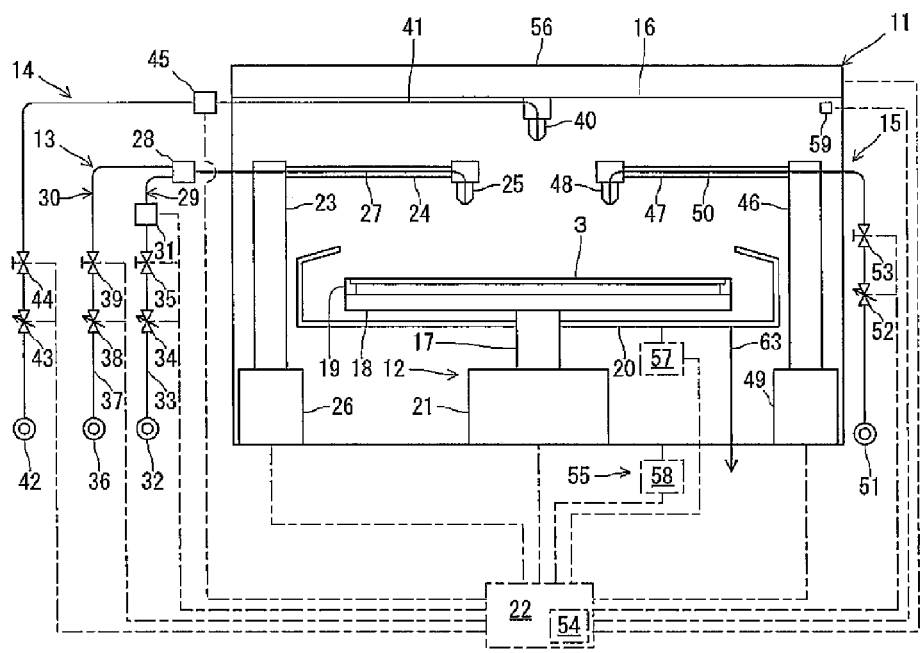
FIG. 2 is a schematic side view illustrating a substrate liquid processing device.

As illustrated in FIG. 2, each of the substrate liquid processing devices 11 includes: a substrate holding unit 12 that holds the substrate 3; a mixed liquid supplying unit 13 that supplies a mixed liquid of sulfuric acid and hydrogen peroxide (SPM) to perform a liquid processing for the substrate 3; an OH-group supplying unit 14 that supplies a fluid containing OH-group (deionized water) to the mixed liquid supplied to the substrate 3; and a rinse liquid supplying unit 15 that supplies a rinse liquid (deionized water) to the substrate 3 to perform a rinse processing for the substrate 3.

The substrate holding unit 12 is configured such that a rotation shaft 17 that extends in a vertical direction is provided within a substrate processing chamber 16, a turn table 18 in a circular plate shape is attached to the top end of the rotation shaft 17, and substrate holders 19 are attached to the outer peripheral portion of the top surface of the turn table 18 with an interval in a circumference direction. A cup 20 is provided in the outside of the turn table 18 (the substrate 3) to recover the OH-group containing fluid, and the rinse liquid or the mixed liquid supplied to the substrate 3. Further, the cup 20 is connected to a drain 63 that discards, for example, the recovered mixed liquid to the outside.

The substrate holding unit 12 is configured such that the rotation shaft 17 is connected with a substrate rotating mechanism 21, and the rotation shaft 17 is rotated using the substrate rotating mechanism 21, thereby rotating the substrate 3 held horizontally by the substrate holders 19. The operation of the substrate rotating mechanism 21 is controlled by a control unit 22. In addition, the control unit 22 controls the operation of the entire substrate processing apparatus 1. Further, the control unit 22 is connected to a substrate elevating mechanism (not illustrated) that ascends/descends the substrate 3 disposed on the turn table 18.

The mixed liquid supplying unit 13 is configured such that a support shaft 23 that extends in a vertical direction is provided within the substrate processing chamber 16, an arm 24 is attached to the top end of the support shaft 23 horizontally, and a mixed liquid supplying nozzle 25 is attached to the front end of the arm 24 in a state where a discharging port of the mixed liquid supplying nozzle 25 faces downward.

The mixed liquid supplying unit 13 is configured such that the support shaft 23 is connected with a nozzle rotating mechanism 26, and the support shaft 23 is rotated by the nozzle rotating mechanism 26, thereby moving the mixed liquid supplying nozzle 25 from a retreat position in the outside of the outer peripheral of the substrate 3 to a supply position above the central portion of the substrate 3. The operation of the nozzle rotating mechanism 26 is controlled by the control unit 22.

Further, the mixed liquid supplying unit 13 is configured such that the mixed liquid supplying nozzle 25 is connected with a mixer 28 through a mixed liquid supplying pipe 27, and the mixer 28 is connected with a sulfuric acid supplying unit 29 and a hydrogen peroxide supplying unit 30. Further, the mixer 28 may mix and supply the sulfuric acid and the hydrogen peroxide to the mixed liquid supplying pipe 27, and may be a joint or a stirring mixing device.

The sulfuric acid supplying unit 29 is configured such that a sulfuric acid supply source 32 that supplies sulfuric acid is connected with the mixer 28 through a sulfuric acid supplying pipe 33. A flow rate control valve 34 and an opening/closing valve 35 are interposed on the sulfuric acid supplying pipe 33. The flow rate control valve 34 and the opening/closing valve 35 are controlled by the control unit 22. Further, a temperature controller 31 is interposed on the sulfuric acid supplying pipe 33. The operation of the temperature controller 31 is controlled by the control unit 22. Further, the temperature of the sulfuric acid supplied from the sulfuric acid supplying unit 29 is controlled by the temperature controller 31, but the temperature of the mixed liquid supplied from the mixed liquid supplying unit 13 is controlled by, for example, the temperature of the sulfuric acid or a mixing ratio of the sulfuric acid with the hydrogen peroxide.

The hydrogen peroxide supplying unit 30 is configured such that a hydrogen peroxide supply source 36 that supplies hydrogen peroxide is connected with the mixer 28 through a hydrogen peroxide supplying pipe 37. A flow rate control valve 38 and an opening/closing valve 39 are interposed on the hydrogen peroxide supplying pipe 37. The flow rate control valve 38 and the opening/closing valve 39 are controlled by the control unit 22.

Then, the mixed liquid supplying unit 13 is configured such that the sulfuric acid supplied from the sulfuric acid supplying unit 29 and the hydrogen peroxide supplied from the hydrogen peroxide supplying unit 30 are mixed in a predetermined ratio (e.g., sulfuric acid:hydrogen peroxide=20:1) to generate a mixed liquid, and the mixed liquid is supplied from the mixed liquid supplying nozzle 25 to the substrate 3 in a predetermined temperature (e.g., 150° C.).

The OH-group supplying unit 14 is configured such that an OH-group supplying nozzle 40 is installed within the substrate processing chamber 16 in a state where a discharging port of the nozzle 40 faces downward, and an OH-group containing fluid supply source 42 that supplies a fluid containing OH-group (OH-group containing fluid, here, deionized water) is connected to the OH-group supplying nozzle 40 through an OH-group supplying pipe 41. A flow rate control valve 43, an opening/closing valve 44 and a temperature controller 45 are interposed on the OH-group supplying pipe 41. The flow rate control valve 43 and the opening/closing valve 44 are controlled by the control unit 22. The operation of the temperature controller 45 is controlled by the control unit 22. Here, a single fluid nozzle is used as the OH-group supplying nozzle 40 which generates a fine liquid droplet. Further, the OH-group supplying nozzle 40 may be configured such that the discharging port thereof faces laterally without limiting to the case where the discharging port thereof faces downward.

The OH-group supplying unit 14 sprays OH-group containing fluid from the OH-group supplying nozzle 40 to the inside of the substrate processing chamber 16 in a predetermined temperature (e.g., 50° C.).

The rinse liquid supplying unit 15 is configured such that a support shaft 46 that extends in a vertical direction is installed within the substrate processing chamber 16, an arm 47 is attached to the top end of the support shaft 46 horizontally, and a rinse liquid supplying nozzle 48 is attached to the front end of the arm 47 in a state where a discharging port of the rinse liquid supplying nozzle 48 faces downward.

The rinse liquid supplying unit 15 is configured such that the support shaft 46 is connected with a nozzle rotating mechanism 49, and the support shaft 46 is rotated by the nozzle rotating mechanism 49, thereby moving the rinse liquid supplying nozzle 48 from a retreat position in the outside of the outer peripheral of the substrate 3 to a supply position above the central portion of the substrate 3. The operation of the nozzle rotating mechanism 49 is controlled by the control unit 22.

Further, the rinse liquid supplying unit 15 is configured such that the rinse liquid supplying nozzle 48 is connected with a rinse liquid supply source 51 that supplies rinse liquid through a rinse liquid supplying pipe 50. A flow rate control valve 52 and an opening/closing valve 53 are interposed on the rinse liquid supplying pipe 50. The flow rate control valve 52 and the opening/closing valve 53 are controlled by the control unit 22.

A ventilation unit 55 is installed in the substrate liquid processing device 11, which is used to perform ventilation (intake and exhaust) of the substrate processing chamber 16.

The ventilation unit 55 is configured such that a fan unit 56 is installed in the upper portion of the substrate processing chamber 16. The fan unit 56 supplies the cleaned air to the inside of the substrate processing chamber 16. Further, the ventilation unit 55 is configured such that a first exhaust unit 57 is connected with the cup 20, and a second ventilation unit 58 is connected with the substrate processing chamber 16. The first exhaust unit 57 discharges the air inside the cup 20 (near the substrate 3) to the outside of the cup 20. The second exhaust unit 58 discharges the air inside the substrate processing chamber 16 to the outside of the substrate processing apparatus 1. Further, the ventilation unit 55 is configured such that a humidity detector 59 is provided inside the substrate processing chamber 16 (near the substrate 3). The fan unit 56, and the first and second exhaust units 57, 58 are controlled by the control unit 22 based on the detected result of the humidity detector 59, The substrate processing apparatus 1 is configured as described above, and the substrate 3 is processed with a liquid in each of the substrate processing devices 11 according to a substrate processing program recorded in a storage medium 54 which is readable by the control unit 22 (e.g., a computer). Here, a liquid processing is performed in which the mixed liquid of the sulfuric acid and the hydrogen peroxide is supplied to the substrate 3 on which a target layer to be removed made of a resist layer is formed in the surface of the underlying layer made of a nitride layer, thereby removing the target layer. Further, the storage medium 54 may be a medium in which various programs such as, for example, a substrate processing program may be recorded, and a semiconductor memory type storage medium such as, for example, a ROM or a RAM, or a disk type storage medium such as, for example, a hard disk or a CD-ROM.

Figures 3, 4:
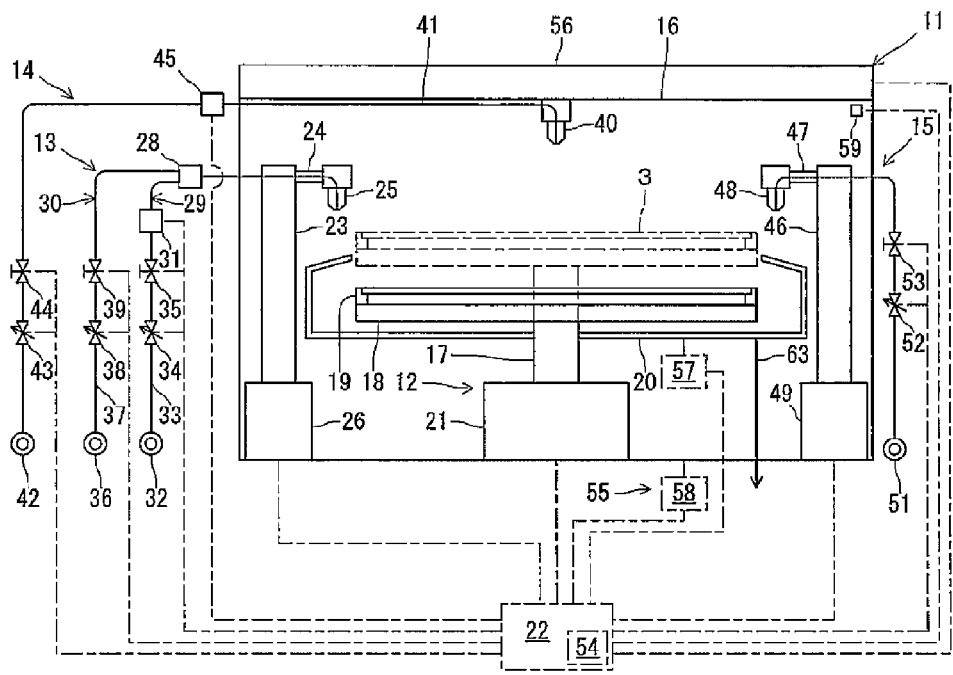
FIG. 3 is an explanatory view illustrating the substrate liquid processing device of FIG. 2 in a substrate receiving process.
FIG. 4 is an explanatory view illustrating the substrate liquid processing device of FIG. 2 in a liquid processing.

First, the substrate processing apparatus 1 performs a substrate receiving process where the substrate 3 transported by the substrate transporting device 10 is received in one of the substrate liquid processing devices 11 (see, e.g., FIG. 3).

In the substrate receiving process, the turn table 18 is raised up to a predetermined position by the substrate elevating mechanism of the substrate holding unit 12. A single sheet of substrate 3 transported to the inside of the substrate processing chamber 16 from the substrate transporting device 10 is received in a state where the substrate 3 is held by the substrate holders 19 horizontally. Then, the turn table 18 descends up to a predetermined position by the substrate elevating mechanism. Further, the mixed liquid supplying nozzle 25 and the rinse liquid supplying nozzle 48 are retreated to the retreat positions in the outside of the outer peripheral of the turn table 18, respectively. The ventilation unit 55 drives the fan unit 56 and the first and second exhaust units 57, 58.

Next, the substrate processing apparatus 1 performs a liquid processing where the surface of the substrate 3 is processed with the mixed liquid (see, e.g., FIG. 4).

In the liquid processing, the support shaft 23 is rotated by the nozzle rotating mechanism 26 of the mixed liquid supplying unit 13 to move the mixed liquid supplying nozzle 25 to the supply position above the central portion of the substrate 3. In addition, the turn table 18 is rotated by the substrate rotating mechanism 21 of the substrate holding unit 12 to rotate the substrate 3. Then, the opening/closing valves 35, 39 of the mixed liquid supplying unit 13 are opened, the sulfuric acid and the hydrogen peroxide of which flow rates are adjusted by the flow rate control valves 34, 38 are mixed in the mixer 28, and the mixed liquid is discharged toward the surface of the substrate 3 from the mixed liquid supplying nozzle 25 in a temperature adjusted by the temperature controller 31. Further, the mixed liquid supplying nozzle 25 are reciprocated horizontally along the substrate 3 by the nozzle rotating mechanism 26 of the mixed liquid supplying unit 13. In the liquid processing, the intake/exhaust amount of the fan unit 56 and the first and second exhaust units 57, 58 is reduced by the ventilation unit 55 than those of the substrate receiving process and a rinse processing below. Therefore, the humidity near the substrate 3 is constantly maintained. Further, in the last of the liquid processing, the support shaft 23 is rotated by the nozzle rotating mechanism 26 of the mixed liquid supplying unit 13 to move the mixed liquid supplying nozzle 25 to the retreat position in the outside of the outer peripheral of the substrate 3. In addition, the opening/closing valves 35, 39 are closed to stop the discharge of the sulfuric acid and the hydrogen peroxide (mixed liquid).

In the liquid processing, the opening/closing valve 44 of the OH-group supplying unit 14 is opened, and the OH-group containing fluid in a flow rate adjusted by the flow rate control valve 43 is sprayed toward the inside of the substrate processing chamber 16 from the OH-group supplying nozzle 40 in a predetermined temperature when the mixed liquid is supplied to the substrate 3 by the mixed liquid supplying unit 13. Further, in the last in the liquid processing, the opening/closing valve 44 of the OH-group supplying unit 14 is closed to stop the spray of the OH-group containing fluid.

Here, the mixed liquid supplying unit 13 supplies the mixed liquid of the sulfuric acid and the hydrogen peroxide in a mixing ratio of the hydrogen peroxide (e.g., sulfuric acid: hydrogen peroxide=20:1) and a temperature (e.g., 150° C.) without damaging the underlying layer formed on the surface of the substrate 3. Further, the temperature of the mixed liquid may be 100° C. to 180° C. Further, the mixing ratio of sulfuric acid and hydrogen peroxide may be sulfuric acid:hydrogen peroxide=10:1 to 25:1.

Further, the OH-group supplying unit 14 supplies the OH-group containing fluid in a temperature (e.g., 50° C.) without damaging the underlying layer of the substrate 3 and an amount without damaging the underlying layer of the substrate 3 when the mixed liquid supplied to the substrate 3 from the mixed liquid supplying unit 13 and an OH-group contained in the OH-group containing fluid are mixed on the surface of the substrate 3. Further, the OH-group containing fluid may be an ozone water (not limited to a deionized water), and may be, for example, a vapor (not limited to a droplet). Further, the temperature of the OH-group containing fluid may be equal to or less than the temperature of the mixed liquid, and preferably 20° C. to 60° C.

When the mixed liquid of the sulfuric acid and the hydrogen peroxide is supplied to the substrate 3, a reactive species such as, for example, OH radical or Caro's acid ($H_2SO_5$) are generated by the mixing (reaction) of the sulfuric acid and the hydrogen peroxide. The target layer formed in the surface of the underlying layer may be removed by the operation of the reactive species. At that time, if the OH-group containing fluid is supplied to the mixed liquid supplied from the mixed liquid supplying unit 13, the reactive species such as, for example, OH radical generated by the mixing of the sulfuric acid and the hydrogen peroxide is increased in the vicinity of the surface of the substrate 3. Therefore, the removing activity for the target layer may be improved, the target layer may be further removed. The target layer may be further removed while the underlying layer of the substrate 3 is not damaged and the film loss of the underlying layer is suppressed in a case where the mixed liquid is supplied from the mixed liquid supplying unit 13 in a temperature and a mixing ratio of the hydrogen peroxide without damaging the underlying layer formed in the surface of the substrate 3, and the OH-group containing fluid is supplied to the substrate 3 from the OH-group supplying unit 13 in an amount without damaging the underlying layer of the substrate 3 when the mixed liquid and the OH-group are mixed.

Figure 5:
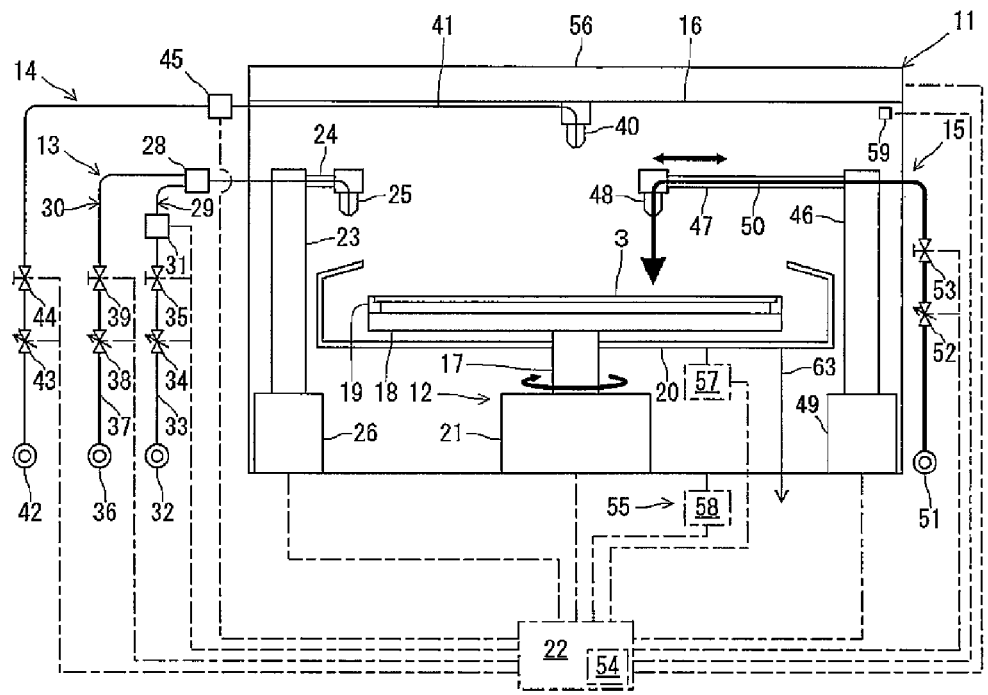
FIG. 5 is an explanatory view illustrating the substrate liquid processing device of FIG. 2 in a rinse processing.

Next, the substrate processing apparatus 1 performs a rinse processing where the surface of the substrate 3 is processed with the rinse liquid (see, e.g., FIG. 5).

In the rinse processing, the support shaft 46 is rotated by the nozzle rotating mechanism 49 of the rinse liquid supplying unit 15 to move the rinse liquid supplying nozzle 48 to the supply position above the central portion of the substrate 3. In addition, the turn table 18 is rotated by the substrate rotating mechanism 21 of the substrate holding unit 12 to rotate the substrate 3. Then, the opening/closing valve 53 of the rinse liquid supplying unit 15 is opened, the rinse liquid in a flow rate adjusted by the flow rate control valve 52 is discharged toward the surface of the substrate 3 from the rinse liquid supplying nozzle 48. Further, the rinse liquid supplying nozzle 48 are reciprocated horizontally along the substrate 3 by the nozzle rotating mechanism 49 of the rinse liquid supplying unit 15. Here, the ventilation unit 55 increases the intake/exhaust amounts of the fan unit 56 and the first and second exhaust units 57, 58, than those of the previous liquid processing. Accordingly, the inside of the substrate processing chamber 16 may be quickly ventilated, and thus, the dry of the substrate 3 may be efficiently performed in a later dry processing. Further, in the last of the rinse processing, the support shaft 46 is rotated by the nozzle rotating mechanism 49 of the rinse liquid supplying unit 15 to move the rinse liquid supplying nozzle 48 to the retreat position in the outside of the outer peripheral of the substrate 3. Further, the opening/closing valve 53 is closed to stop the discharge of the rinse liquid.

Figure 6:
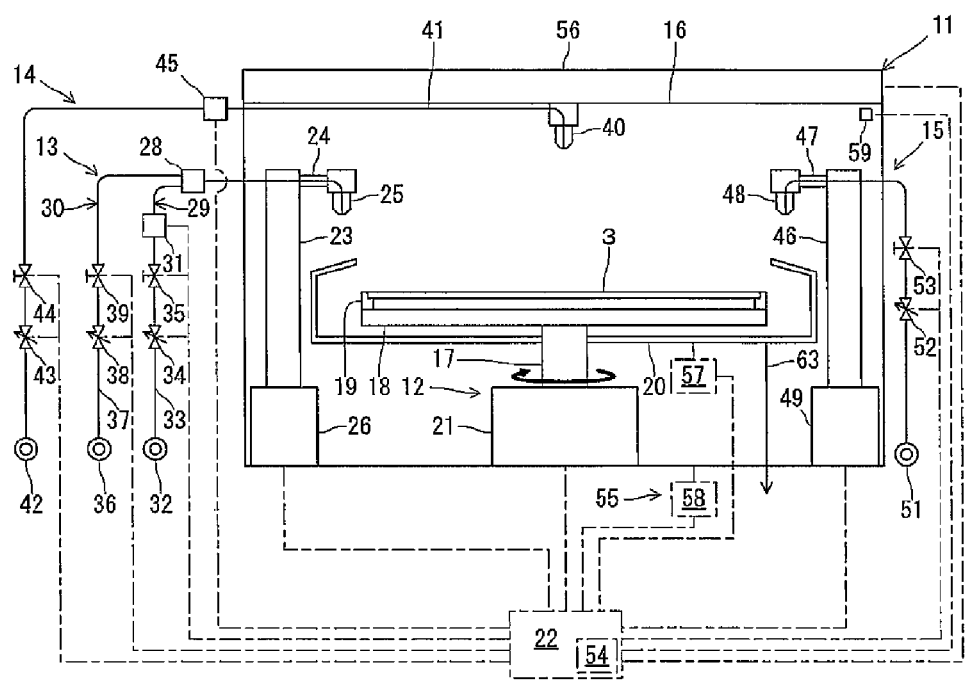
FIG. 6 is an explanatory view illustrating the substrate liquid processing device of FIG. 2 in a dry processing.

Next, the substrate processing apparatus 1 performs a dry processing where the rinse liquid is scattered and removed from the surface of the substrate 3 by rotating the substrate 3 (see, e.g., FIG. 6).

In the dry processing, the turn table 18 is rotated by the substrate rotating mechanism 21 of the substrate holding unit 12 to rotate the substrate 3. By rotating the substrate 3, the rinse liquid remaining on the surface of the substrate 3 is scattered by centrifugal force of the rotating substrate 3 and the rinse liquid is removed and dried from the surface of the substrate 3.

Figure 7:
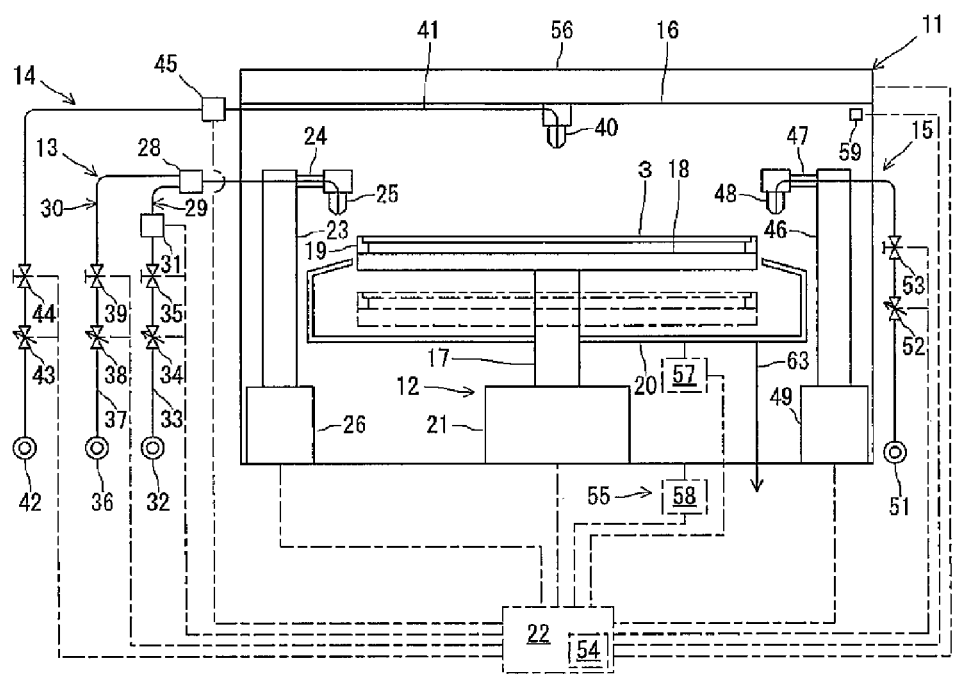
FIG. 7 is an explanatory view illustrating the substrate liquid processing device of FIG. 2 in a substrate transferring process.

Finally, the substrate processing apparatus 1 performs a substrate transferring process where the substrate 3 is transferred to the substrate transporting device 10 from the substrate liquid processing device 11 (see, e.g., FIG. 7).

In the substrate transferring process, the rotation of the turn table 18 is stopped by the substrate rotating mechanism 21 of the substrate holding unit 12, and the turn table 18 ascends up to a predetermined position by the substrate elevating mechanism. Then, the substrate 3 held by the turn table 18 is transferred to the substrate transporting device 10. Then, the turn table 18 descends up to a predetermined position by the substrate elevating mechanism. Further, the mixed liquid supplying nozzle 25 and the rinse liquid supplying nozzle 48 are retreated to the retreat positions in the outside of the outer peripheral of the turn table 18, respectively.

As described above, the substrate processing apparatus 1 includes the substrate processing chamber 16 that processes a substrate 3, the substrate holding unit 12 that holds the substrate 3 and is provided in the substrate processing chamber 16, the mixed liquid supplying unit 13 that supplies mixed liquid of sulfuric acid and hydrogen peroxide to the substrate 3 held by the substrate holding unit 12, and the OH-group supplying unit 14 that supplies OH-group containing fluid to the mixed liquid supplied to the substrate 3 from the mixed liquid supplying unit 13.

In the above-described substrate processing apparatus 1, the mixed liquid of the sulfuric acid and the hydrogen peroxide is supplied to the substrate 3 of which the target layer is formed on the surface of the underlying layer, thereby removing the target layer.

At that time, in the substrate processing apparatus 1, the mixed liquid from the mixed liquid supplying unit 13 is supplied in a temperature and a mixing ratio of the hydrogen peroxide without damaging the underlying layer of the substrate 3, and the OH-group containing fluid is supplied from the OH-group supplying unit 14 to the substrate 3 in an amount where the underlying layer of the substrate 3 is not damaged when the mixed liquid and the OH-group are mixed.

Therefore, in the substrate processing apparatus 1, the target layer formed on the surface of the underlying layer may be further removed while the underlying layer formed on the surface of the substrate 3 is not damaged.

The OH-group supplying unit 14 is not limited to the above-described configuration, and the OH-group containing fluid may be supplied to the substrate 3 from the mixed liquid supplying unit 13.

That is, the OH-group supplying nozzle 40 is not limited to a case where the nozzle 40 supplies the OH-group containing fluid in the droplet type to the substrate 3 as in the above-described substrate processing apparatus 1.

Figure 8:
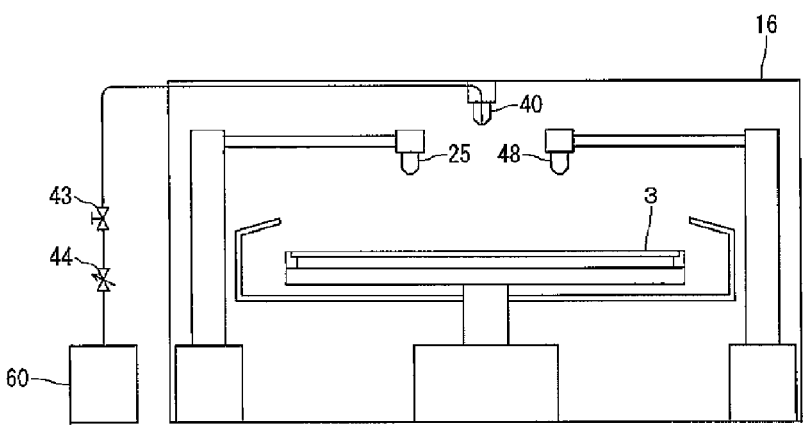
FIG. 8 is a schematic side view illustrating another substrate liquid processing device.

For example, as illustrated in FIG. 8, the OH-group supplying nozzle 40 is connected to a vapor generating device 60, and thus, OH-group containing fluid may be supplied from the OH-group supplying nozzle 40 to the substrate 3.

Figure 9:
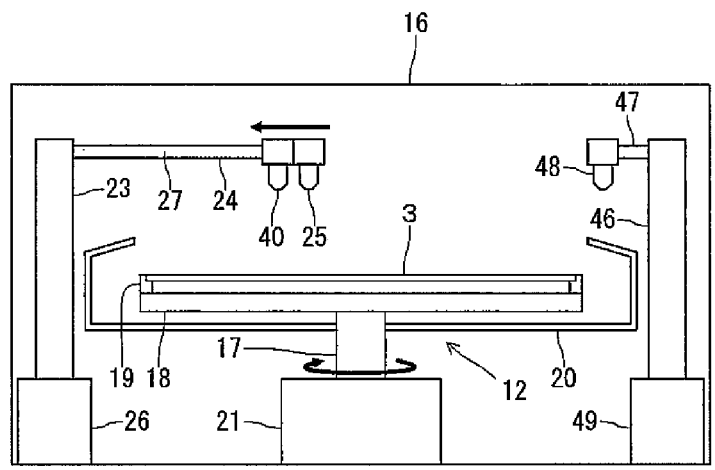
FIG. 9 is a schematic side view illustrating yet another substrate liquid processing device.

Further, the OH-group supplying nozzle 40 is not fixed, but may be configured to be movable. In that case, while a dedicated nozzle rotating mechanism may be provided in the OH-group supplying nozzle 40 as in the mixed liquid supplying nozzle 25. Alternatively, as illustrated in FIG. 9, the OH-group supplying nozzle 40 may be connected to the mixed liquid supplying nozzle 25 to move the OH-group supplying nozzle 40 by the nozzle rotating mechanism 26 of the mixed liquid supplying nozzle 25. When the OH-group supplying nozzle 40 is fixed, the OH-group containing fluid may be supplied to the entire inside of the substrate processing chamber 16. However, when the OH-group supplying nozzle 40 is capable of being moved, the OH-group containing fluid may be supplied locally to the portion where the mixed liquid is supplied to the substrate 3 from the mixed liquid supplying unit 13, and the more mixed liquid may be supplied locally to improve the removing ability for the target layer, thereby decreasing the consumption of the OH-group containing fluid.

Figure 10A:
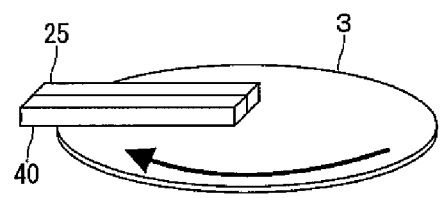
FIGS. 10A to 10C are schematic side views each illustrating still yet another substrate liquid processing device with different nozzle structures.
Figure 10B:
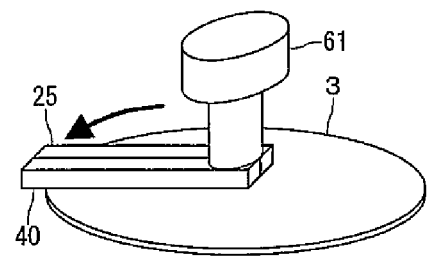
Figure 10C:
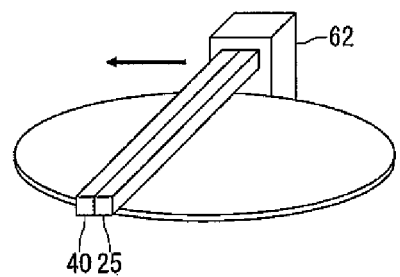

Further, the OH-group supplying nozzle 40 may discharge the OH-group containing fluid in a type of, for example, droplets, smog, and vapors. The OH-group supplying nozzle 40 is not limited to the single fluid nozzle, but may be configured as a twin fluid nozzle that discharges the OH-group containing fluid along with a gas such as, for example, nitrogen. In addition, the OH-group supplying nozzle 40 may be configured such that the OH-group containing fluid may be sprayed in a smog type by an ultrasonic vibrator. Further, the OH-group supplying nozzle 40 is not limited to a cylindrical nozzle that extends in a vertical direction, and may be a bar nozzle where a plurality of discharging ports are formed side by side in a bar that extends in a horizontal direction, as illustrated in FIG. 10. Further, the mixed liquid supplying nozzle 25 may be, for example, a single fluid nozzle, a twin fluid nozzle, and a bar nozzle as well.

Further, the OH-group supplying nozzle 40 or the mixed liquid supplying nozzle 25 may supply the OH-group containing fluid or the mixed liquid to the entire area of the surface of the substrate 3. In that case, the OH-group supplying nozzle 40 or the mixed liquid supplying nozzle 25 may be moved relative to the substrate 3. For example, the substrate 3 and the OH-group supplying nozzle 40 or the mixed liquid supplying nozzle 25 may be moved (see, e.g., FIG. 2), only the substrate 3 may be moved (see, e.g., FIG. 10A), only the OH-group supplying nozzle 40 or the mixed liquid supplying nozzle 25 may be moved by the nozzle rotating mechanism 61 (see, e.g., FIG. 10B), and only the OH-group supplying nozzle 40 or the mixed liquid supplying nozzle 25 may be moved by the nozzle moving mechanism 62 (see, e.g., FIG. 10C). In that case, the OH-group supplying nozzle 40 may efficiently supply the OH-group to the mixed liquid as the OH-group supplying nozzle 40 is provided at the upstream side than the mixed liquid supplying nozzle 25 that moves relative to the substrate 3.

Figure 11:
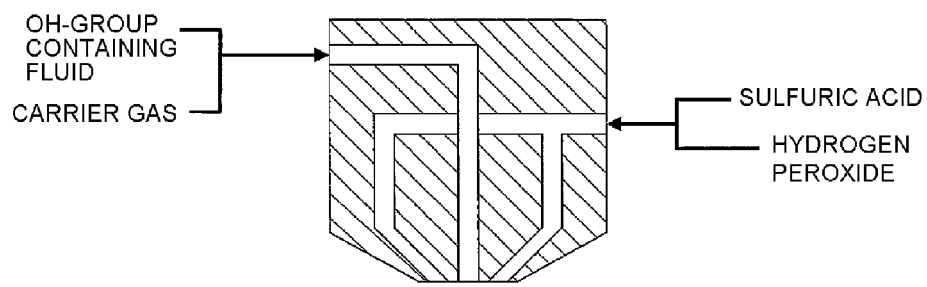
FIG. 11 is a schematic side cross-sectional view illustrating still yet another substrate liquid processing device.

Further, the OH-group supplying nozzle 40 or the mixed liquid supplying nozzle 25 is not limited to a case where they are provided separately, may be a twin fluid nozzle where they are integrated, as illustrated in FIG. 11. In that case, the OH-group containing fluid which is mixed into a carrier gas such as, for example, a nitrogen gas may be discharged from a central discharging port, and the mixed liquid of the sulfuric acid and the hydrogen peroxide may be discharged from discharging port which is in vicinity of the central discharging port.

Further, the OH-group supplying unit 14 may supply the OH-group containing fluid before the mixed liquid is supplied to the substrate 3 from the mixed liquid supplying unit 13, and supply the OH-group containing fluid at the same time of the supply of the mixed liquid by the mixed liquid supplying unit 13. Further, in a case where the OH-group is supplied to the inside of the substrate processing chamber 16 as a whole from the OH-group supplying unit 14, the OH-group containing fluid may be supplied before the mixed liquid is supplied to the substrate 3 from the mixed liquid supplying unit 13.

Further, the substrate liquid processing device 11 may be controlled such that the amount or the temperature of the supplied OH-group (OH-group containing fluid) during the supply of the OH-group from the initiation of the supply of the OH-group containing fluid to the stop of the supply by the OH-group supplying unit 14.

That is, the hardened layer may be removed in a state where the removing ability is high at a step in which the target layer is thick, and the hardened layer may be removed in a state where the removing ability for the hardened layer is decreased at a step in which the target layer becomes thinner to be initiate to expose the underlying layer, which is near the stop of the supply of the OH-group containing fluid.

For example, the amount or the temperature of the supplied OH-group (OH-group containing fluid) right before the stop of the supply may be controlled to be decreased as compared to right after the supply of the OH-group containing fluid is initiated.

In that case, the hardened layer formed in the target layer may be removed in a state where the removing ability is relatively high right after the initiating of the supply, and thus, the target layer may be removed quickly while the underlying layer is not damaged. Further, the same effect may be obtained by performing a control to decrease the temperature or the mixing ratio of the hydrogen peroxide included in the supplied mixed liquid during the supply of the mixed liquid from the initiation of the supply of the mixed liquid by the mixed liquid supplying unit 12 to the stop of the supply. Further, for example, the temperature may be decreased gradually or step by step.

Further, in the substrate liquid processing device 11, the ventilator unit 55 may be controlled based on the humidity in the vicinity of the substrate 3 which is detected by the humidity detector 59 to maintain the humidity in the vicinity of the substrate 3. For example, as seen from the result of the preliminary experiment illustrated in Table 1, when the mixing ratio of the mixed liquid of the sulfuric acid and the hydrogen peroxide (sulfuric acid:hydrogen peroxide) is 6:1 and the temperature is 214° C., the target layer may be removed at humidity of 20%, but when the mixing ratio is 20:1 and the temperature is 154° C., the target layer may not be removed at humidity of 20%, the room of improvement is seen at humidity of 53%, and the target layer may be removed at humidity of 80%. As a result, by controlling the humidity near the substrate 3 to be equal to or more than 60%, the target layer may be removed without not damaging the underlying layer.

TABLE 1

| Mixing ratio (sulfuric acid:hydrogen peroxide) | Humidity (%) | Temperature (° C.) | Target layer | Underlying layer |
|---|---|---|---|---|
| 6:1 | 20 | 214 | ○ | X |
| 20:1 | 20 | 154 | X | ○ |
|  | 53 | 154 |  | ○ |
|  | 80 | 154 | ○ | ○ |

Figure 12:
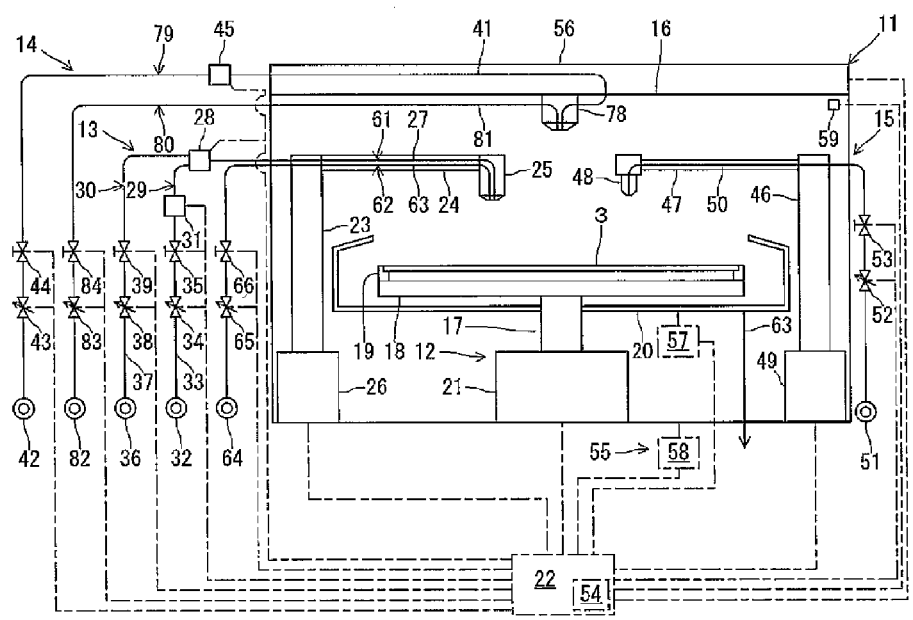
FIG. 12 is a schematic side view illustrating still yet another substrate liquid processing device with an integrated nozzle structure.

Further, in the substrate liquid processing device 11 as illustrated in FIG. 12, the mixed liquid supplying unit 13 is configured such that the droplet type mixed liquid is supplied. Further, in the substrate liquid processing device 11 as illustrated in FIGS. 12 to 15, a portion having the same function as in the substrate liquid processing device 11 illustrated in FIG. 2 has the same reference numeral.

As illustrated in FIG. 12, the mixed liquid supplying unit 13 has a twin fluid nozzle 60 which is attached to the front end of the arm 24 as a mixed liquid supplying nozzle. A mixed liquid supplying path 61 that supplies a mixed liquid in a liquid type and an inert gas supplying path 62 that supplies inert gas in a gas type are connected to the twin fluid nozzle 60.

In the mixed liquid supplying path 61, twin fluid nozzle 60 is connected to the mixer 28 through the mixed liquid supplying pipe 27, and the mixer 28 is connected to the sulfuric acid supplying unit 29 and the hydrogen peroxide supplying unit 30.

In the inert gas supplying path 62, the twin fluid nozzle 60 is connected to a nitrogen gas supply source 64 that supplies inert gas (nitrogen gas) through an inert gas supplying pipe 63. The inert gas supplying pipe 63 is provided with a flow rate control valve 65 and an opening/closing valve 66. The flow rate control valve 65 and the opening/closing valve 66 are controlled by the control unit 22.

Figure 13:
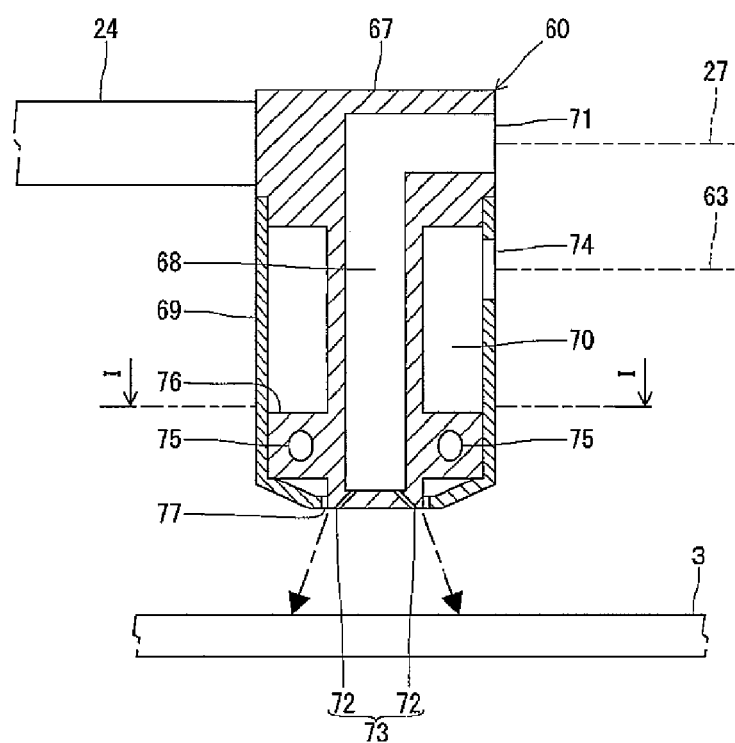
FIG. 13 is a schematic side view illustrating a twin fluid nozzle.
Figure 14:
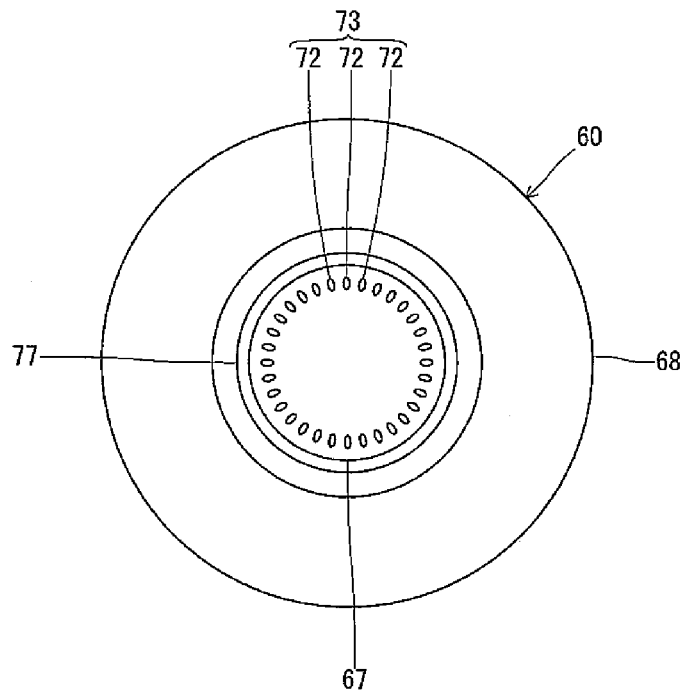
FIG. 14 is a bottom view of the twin fluid nozzle of FIG. 13.
Figure 15:
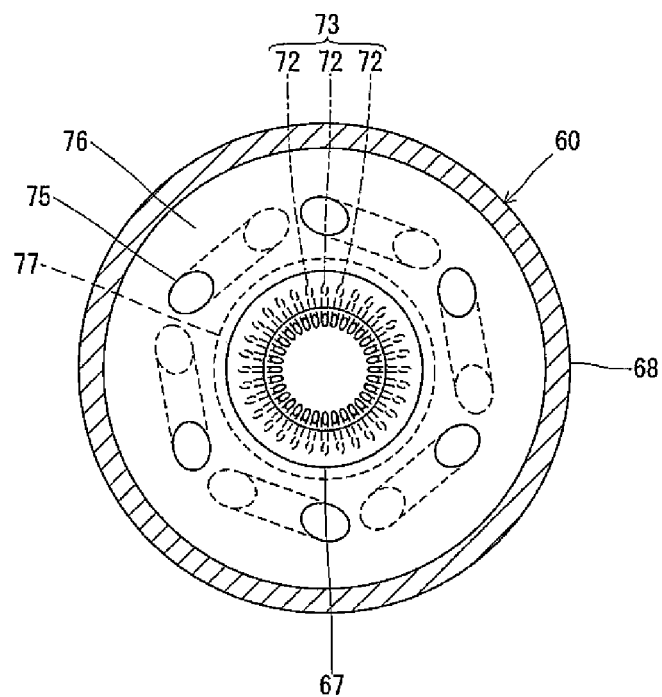
FIG. 15 is a planar cross-sectional view of the twin fluid nozzle of FIG. 13.

The twin fluid nozzle 60 forms a liquid path 68 where the mixed liquid flows within a nozzle body 67 as illustrated in FIGS. 13 to 15. A nozzle cover 69 is attached to the outer peripheral of the nozzle body 67, and a gas path 70 that flows the inert gas between the recess of the outer peripheral of the nozzle body 67 and the inner peripheral of the nozzle cover 69.

The liquid path 68 connects the mixed liquid supply path 61 to a liquid inlet port 71 formed in the top part of the nozzle body 67. In the bottom end of the nozzle body 67, a plurality of (32 in the present example) liquid discharging ports 72 in a circle shape are formed at the same circumference, which are inclined downward toward the outer peripheral from the center of the circumference. And, the plurality of liquid discharging ports 72 constitute a liquid discharging unit 73 that discharges the processing liquid. Accordingly, the twin fluid nozzle 60 may discharge the mixed liquid supplied from the mixed liquid supplying path 61 toward the outer peripheral of the circumference from each liquid discharging port 72 of the liquid discharging unit 73 in a plurality of fine stems shape inclined downward. Further, since the liquid discharging port 72 is formed in a radial shape from the input formed in the edge of the outer peripheral end of the liquid path 68 toward the output formed in the outside than the inner diameter of the liquid path 68, the mixed liquid is diffused and discharged in a wider range than the inner diameter of the liquid path 68 in the fine plurality of fine stems shape.

The gas path 70 connects the inert gas supplying path 62 to a gas inlet port 74 formed in the top part of the nozzle cover 69. In the bottom part of the nozzle body 67, a spiral flow generating unit 76 is provided which is constituted by a plurality of (6 in the present example) inclined holes 75 that are inclined downward in the clock-wise direction when viewed from the below, and a gas discharging port 77 made of circular ring at the concentric circle with the liquid discharging unit 73 between the front end of the nozzle body 67 and the front end of the nozzle cover 69. Accordingly, the twin fluid nozzle 60 discharges the gas supplied from the inert gas supplying path 62 from the gas discharging port 77 toward downward by spiraling at the spiral generating unit 76. At that time, the gas may be discharged in the vertical direction for the substrate 3.

As described above, the twin fluid nozzle 60 forms the liquid discharging unit 73 in which a plurality of liquid discharging ports 72 that discharge the mixed liquid toward the outer peripheral of the circumference inclined downward are disposed in the same circumference in the inside of the gas discharging port 77 in the circle at the concentric with the liquid discharging unit 73.

The twin fluid nozzle 60 discharges the mixed liquid from the plurality of liquid discharging ports 72 of the liquid discharging unit 73 toward the outer peripheral inclined downward and the inert gas from the gas discharging port 77 in the slit shape downward. Accordingly, the mixed liquid and the inert gas are crashed at the vicinity of the liquid discharging unit 73 and the gas discharging port 77 below, the mixed liquid are dispersed by the discharging pressure of the inert gas to form droplets of the mixed liquid in the smog type, and the droplets of the mixed liquid are sprayed to the surface of the substrate 3. At that time, since the mixed liquid is discharged in a plurality of fine stem shapes, the contact area between the inert gas and the mixed liquid may be increased to form droplets having small particle size effectively and evenly. Further, since the inert gas is discharged from the gas discharging port 77 in the slit shape, the inert gas may be collided with the mixed liquid which is discharged in a stem shape to generate droplets evenly. Since the even droplets of the mixed liquid is sprayed to the substrate 3, a physical force may be applied thereto, and thus, the hardened layer formed in the surface of the target layer may be further effectively removed.

Here, the twin fluid nozzle 60 is configured to form adjacent liquid discharging ports 72 in a spaced from with a space more than a predetermined distance such that the mixed liquid does not contact with other mixed liquid by pulling by the negative pressure generated between the mixed liquid discharged from each liquid discharging port 72 when the processing liquid is discharged from the discharging port 72. Specifically, the interval of the outer peripheral end of the adjacent liquid discharging ports 72 is formed to be equal to or more than the diameter of the opening of the liquid discharging port 72. Accordingly, since the mixed liquid discharged in a plurality of fine stem shapes is prevented from being contacted each other to form a thick cylindrical shape, the droplets having small particle sizes may be generated evenly.

Further, the twin fluid nozzle 60 is configured in a state where the interval between the liquid discharging port 72 of the liquid discharging unit 73 and the gas discharging port 77 are equal to or less than a predetermined distance such that the mixed liquid right after the liquid is discharged from each liquid discharging port 72 collides with the inert gas when the processing liquid is discharged from the liquid discharging port 72. Specifically, the twin fluid nozzle 60 is configured in a distance where the mixed liquid collides with the inert gas while the mixed liquid discharged from each liquid discharging port 72 does not contact with other mixed liquid. Accordingly, since the mixed liquid collides with the inert gas in a state where the mixed liquid is in a plurality of fine stem shapes, the droplets having small particle sizes may be generated evenly. Further, there is a concern that a deviation in a height where the mixed liquid collides with the inert gas when the discharging angle of the mixed liquid is dislocated, but the deviation of the collision height may be suppressed by colliding the mixed liquid with the inert gas right after the mixed liquid is discharged. As described above, the deviation of the state when the mixed liquid collides with the inert gas is suppressed, thereby generating the droplets evenly.

Further, twin fluid nozzle 60 does not form the droplet of the mixed liquid evenly or in a small diameter when the mixed liquid discharged from the adjacent liquid discharging ports 72 are in contact with each other to be a cylindrical shape. As a result, the processing liquid and the gas are discharged in an amount and a flow rate where the mixed liquids discharged from the adjacent liquid discharging ports 72 do not contact with each other, and thus, the droplets of the mixed liquid is formed evenly or in a small diameter. Further, in the example, the hydrogen peroxide is supplied by 10 ml per one minute, the sulfuric acid is supplied by 200 ml per one minute, and the inert gas is supplied by 40 L to 80 L (preferably, 60 L) per one minute. The temperature at the time when the mixed liquid approaches the surface of the substrate 3 becomes 100° C. to 120° C. because the mixed liquid is cooled by the inert gas.

Further, in the substrate liquid processing device 11 as illustrated in FIG. 12, the OH-group supplying unit 14 is configured such that the droplet type OH-group containing fluid is supplied. That is, in the OH-group supplying unit 14 is configured such that a twin fluid nozzle 78 is attached to the inside of the substrate processing chamber 16 as an OH-group supplying nozzle, the twin fluid nozzle 78 is connected to an OH-group containing fluid supplying path 79 that supplies the OH-group containing fluid in the liquid type and an inert gas supplying path 80 that supplies inert gas in a gas shape. In the OH-group containing fluid supplying path, the twin fluid nozzle 78 is connected to an OH-group containing fluid supply source 42 that supplies OH-group containing fluid (deionized water) through an OH-group supplying pipe 41. In the inert gas supplying path 80, the twin fluid nozzle 78 is connected to a nitrogen gas supply source 82 that supplies inert gas (nitrogen gas) through an inert gas supplying pipe 81. The inert gas supplying pipe 81 is provided with a flow rate control valve 83 and an opening/closing valve 84. The flow rate control valve 83 and the opening/closing valve 84 are controlled by the control unit 22. The twin fluid nozzle 78 may use one which is illustrated in FIG. 11, the inert gas is discharged from the central discharging port and the OH-group containing fluid is discharged from the discharging ports around the central discharging port.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a substrate processing chamber configured to process a substrate on which a target layer to be removed is formed on the surface of an underlying layer;
    a substrate holding unit provided in the substrate processing chamber and configured to hold the substrate;
    a mixed liquid supplying unit configured to supply a mixed liquid of sulfuric acid and hydrogen peroxide to the substrate held by the substrate holding unit in a mixing ratio and at a temperature that does not damage the underlying layer while removing the target layer;

an OH-group supplying unit configured to supply a fluid containing OH-group to the substrate in an amount that does not damage the underlying layer when the mixed liquid and the OH-group are mixed on the substrate, while supplying the mixed liquid of sulfuric acid and hydrogen peroxide to the substrate; and a controller configured to control operation of the substrate processing apparatus, wherein the controller is configured to control flow rates of sulfuric acid and hydrogen peroxide, wherein the controller is configured to control the OH-group supplying unit such that the controller controls a flow rate of fluid containing OH-group supplied to the substrate, and wherein the controller is programmed such that the amount of the fluid containing OH-group supplied to the substrate is decreased while continuing the supply of the mixed liquid of sulfuric acid and hydrogen peroxide to the substrate, and as the processing progresses and less of the target substrate is removed, the reduction of the supply of the fluid containing OH-group results in less heat being generated and allows removal of the remnants of the target substrate while reducing the risk of damage to the underlying layer.

2. The substrate processing apparatus of claim 1, wherein the OH-group supplying unit is configured to locally supply the OH-group to a portion where the mixed liquid is supplied from the mixed liquid supplying unit.

3. The substrate processing apparatus of claim 2, wherein the mixed liquid supplying unit moves relative to the substrate, and the OH-group supplying unit is provided at an upstream side with respect to a movement direction of the mixed liquid supplying unit that moves relative to the substrate.

4. The substrate processing apparatus of claim 1, wherein the OH-group supplying unit is configured to supply the OH-group to the entire inside of the substrate processing chamber.

5. The substrate processing apparatus of claim 1, wherein the OH-group supplying unit is configured to decrease the temperature of the supplied OH-group during the supply of the OH-group.

6. The substrate processing apparatus of claim 1, wherein the mixed liquid supplying unit is configured to decrease the mixing ratio of the hydrogen peroxide included in the supplied mixed liquid during the supply of the mixed liquid.

7. The substrate processing apparatus of claim 1, wherein the mixed liquid supplying unit is configured to decrease the temperature of the supplied mixed liquid during the supply of the mixed liquid.

8. The substrate processing apparatus of claim 1, wherein the mixed liquid supplying unit includes a twin fluid nozzle where the mixed liquid is made into droplets using inert gas.

9. A substrate processing method comprising:

providing a processing chamber configured to process a substrate on which a target substrate to be removed is formed on the surface of an underlying layer, the substrate being held by a substrate holding unit;

supplying a mixed liquid of sulfuric acid and hydrogen peroxide to the substrate from a mixed liquid supplying unit in a mixing ratio and at a temperature that does not damage the underlying layer while removing the target layer, thereby removing the target layer;

while supplying the mixed liquid of sulfuric acid and hydrogen peroxide to the substrate, supplying a fluid containing OH-group to the substrate from an OH-group supplying unit in an amount that does not damage the underlying layer when the mixed liquid of the sulfuric acid and hydrogen peroxide and the OH-group are mixed on the substrate; and then while continuing the supply of the mixed liquid of sulfuric acid and hydrogen peroxide to the substrate, decreasing the amount of the fluid containing OH-group supplied to the substrate, wherein as the processing progresses and less of the target substrate is removed, the reduction of the supply of the fluid containing OH-group results in less heat being generated and allows removal of the remnants of the target substrate while reducing the risk of damage to the underlying layer.

10. The substrate processing method of claim 9, wherein the OH-group is locally supplied to a portion to which the mixed liquid is supplied.

11. The substrate processing method of claim 10, wherein the portion to which the mixed liquid is supplied is moved relative to the substrate, and the OH-group is supplied at an upstream side with respect to the progressing direction of the moving portion to which the mixed liquid is supplied.

12. The substrate processing method of claim 9, wherein the OH-group is supplied to the entire inside of the substrate processing chamber.

13. The substrate processing method of claim 9, wherein the temperature of the supplied OH-group is decreased during the supply of the OH-group.

14. The substrate processing apparatus of claim 9, wherein the mixing ratio of the hydrogen peroxide included in the supplied mixed liquid is decreased during the supply of the mixed liquid.

15. The substrate processing apparatus of claim 9, wherein the temperature of the supplied mixed liquid is decreased during the supply of the mixed liquid.

16. The substrate processing method of claim 9, wherein the mixed liquid is made into droplets using inert gas.

17. A non-transitory computer-readable storage medium for storing a computer program that, when executed, cause a computer to perform a substrate processing method, the substrate processing method comprising:

providing a processing chamber configured to process a substrate on which a target layer to be removed is formed on the surface of an underlying layer, the substrate being held by a substrate holding unit;

supplying a mixed liquid of sulfuric acid and hydrogen peroxide to the substrate from a mixed liquid supplying unit in a mixing ratio and at a temperature that does not damage the underlying layer while removing the target layer, thereby removing the target layer;

while supplying the mixed liquid of sulfuric acid and hydrogen peroxide to the substrate, supplying a fluid containing OH-group to the substrate from an OH-group supplying unit in an amount that does not damage the underlying layer when the mixed liquid of the sulfuric acid and hydrogen peroxide and the OH-group are mixed on the substrate; and then while continuing the supply of the mixed liquid of sulfuric acid and hydrogen peroxide to the substrate, decreasing the amount of the fluid containing OH-group supplied to the substrate, wherein as the processing progresses and less of the target layer is removed, the reduction of the supply of the fluid containing OH-group results in less heat being generated and allows removal of the remnants of the target layer while reducing the risk of damage to the underlying layer.

* * * * *